(12) United States Patent
Miomo et al.

(10) Patent No.: US 10,802,752 B2
(45) Date of Patent: Oct. 13, 2020

(54) MEMORY SYSTEM FOR CONTROLLING MEMORY ACCESS BASED ON ACCESS TIME OF MEMORY

(71) Applicant: TOSHIBA MEMORY CORPORATION, Minato-ku, Tokyo (JP)

(72) Inventors: Takahiro Miomo, Kanagawa (JP); Prashob Ramachandran Nair, Kanagawa (JP); Hajime Yamazaki, Kanagawa (JP); Makoto Domon, Kanagawa (JP); Yasunori Nakamura, Kanagawa (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 0 days.

(21) Appl. No.: 15/695,773

(22) Filed: Sep. 5, 2017

(65) Prior Publication Data
US 2018/0267744 A1 Sep. 20, 2018

(30) Foreign Application Priority Data
Mar. 17, 2017 (JP) .................... 2017-052154

(51) Int. Cl.
*G06F 3/06* (2006.01)
*G06F 9/46* (2006.01)
(52) U.S. Cl.
CPC .......... *G06F 3/0659* (2013.01); *G06F 3/0613* (2013.01); *G06F 3/0625* (2013.01); *G06F 3/0658* (2013.01); *G06F 3/0679* (2013.01); *G06F 3/0688* (2013.01); *G06F 9/46* (2013.01)
(58) Field of Classification Search
CPC ............................ G06F 3/0659; G06F 3/0625
See application file for complete search history.

(56) References Cited

U.S. PATENT DOCUMENTS

| | | | | |
|---|---|---|---|---|
| 4,430,698 A * | 2/1984 | Harris | ..................... | B29C 47/92 318/561 |
| 9,760,311 B1 * | 9/2017 | Amir | ..................... | G06F 3/0625 |
| 2002/0135796 A1 * | 9/2002 | Alexander | ............. | G06Q 40/04 358/1.15 |
| 2008/0301475 A1 * | 12/2008 | Felter | ..................... | G06F 1/3203 713/300 |
| 2014/0258761 A1 * | 9/2014 | Seroff | ..................... | G06F 1/3206 713/330 |
| 2015/0113305 A1 * | 4/2015 | Shin | ..................... | G06F 1/3275 713/322 |
| 2015/0120074 A1 * | 4/2015 | Kako | ..................... | G06Q 10/04 700/295 |
| 2015/0192975 A1 * | 7/2015 | Kawai | ..................... | G06F 1/3203 713/323 |

(Continued)

*Primary Examiner* — Larry T Mackall
*Assistant Examiner* — Michelle T Bechtold
(74) *Attorney, Agent, or Firm* — Foley & Lardner LLP

(57) ABSTRACT

A memory system includes a first nonvolatile memory, a first processor, and a second processor. The first processor sets a first assignment amount. The second processor performs access to the first nonvolatile memory, calculates a consumed amount which is an amount according to an operation time of the first nonvolatile memory in the access, and transmits a notification to the first processor when the consumed amount reaches the first assignment amount.

10 Claims, 10 Drawing Sheets

(56) References Cited

U.S. PATENT DOCUMENTS

2015/0296049 A1* 10/2015 Green .................. G06Q 10/107
  709/206
2016/0372160 A1   12/2016 Lehmann et al.
2016/0378149 A1   12/2016 Kam et al.

* cited by examiner

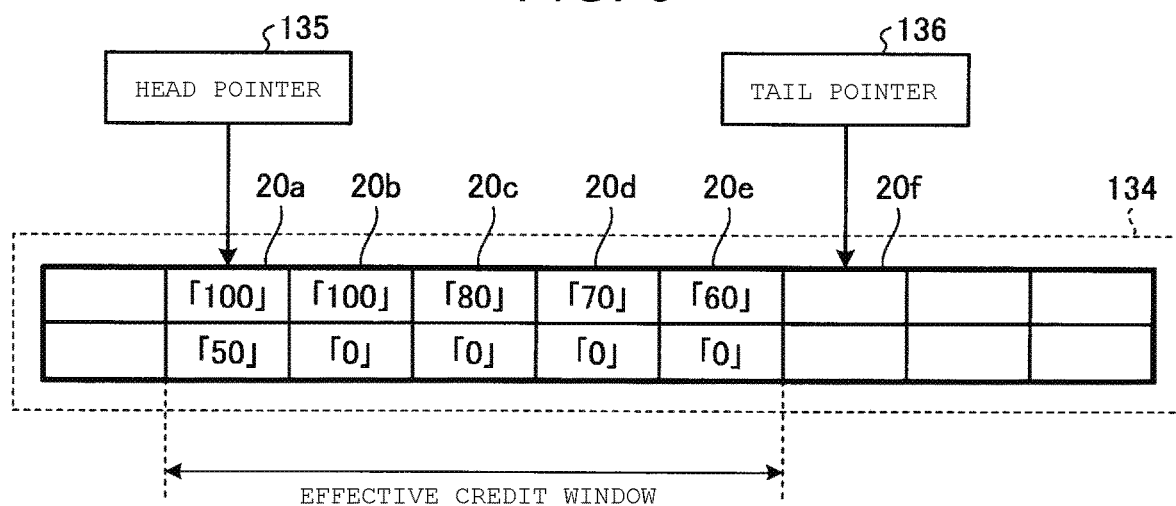
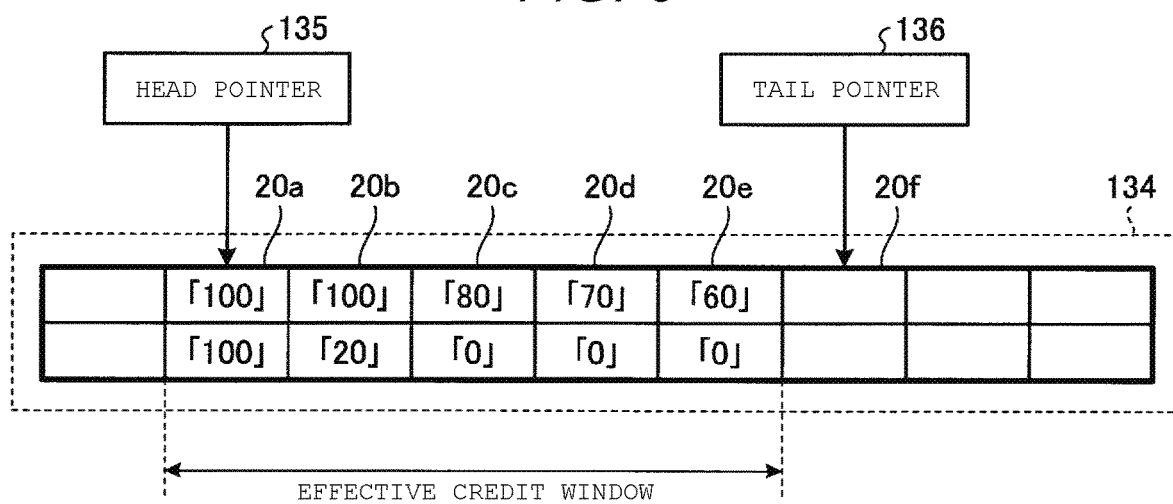

MEMORY SYSTEM FOR CONTROLLING MEMORY ACCESS BASED ON ACCESS TIME OF MEMORY

CROSS-REFERENCE TO RELATED APPLICATION

This application claims the benefit of and priority to Japanese Patent Application No. 2017-052154, filed Mar. 17, 2017, the entire contents of which are incorporated herein by reference.

FIELD

Embodiments described herein relate generally to a memory system.

BACKGROUND

A memory system may adjust performance according to usage conditions and the like. The examples of the usage conditions include power consumption or a temperature of the memory system. In an example, the memory system may limit its own operation such that the power consumption or the temperature does not excessively rise.

DESCRIPTION OF THE DRAWINGS

FIG. 5 is a diagram for explaining an example of another state of data recorded in the FIFO region of some embodiments.

FIG. 6 is a diagram for explaining an example of still another state of data recorded in the FIFO region of some embodiments.

DETAILED DESCRIPTION

An example embodiment is to provide a memory system capable of adjusting performance with a streamlined methodology.

In general, according to some embodiments, a memory system may include a first nonvolatile memory, a first processor, and a second processor. The first processor may set a first assignment amount. The second processor may perform access to the first memory, calculate a consumed amount which is an amount according to an operation time of the first memory in the access, and transmit a notification to the first processor when the consumed amount reaches the first assignment amount.

In the following, a memory system according to some embodiments will be described in detail with reference to the accompanying drawings. The present disclosure is not limited to these embodiments.

Figure 1:
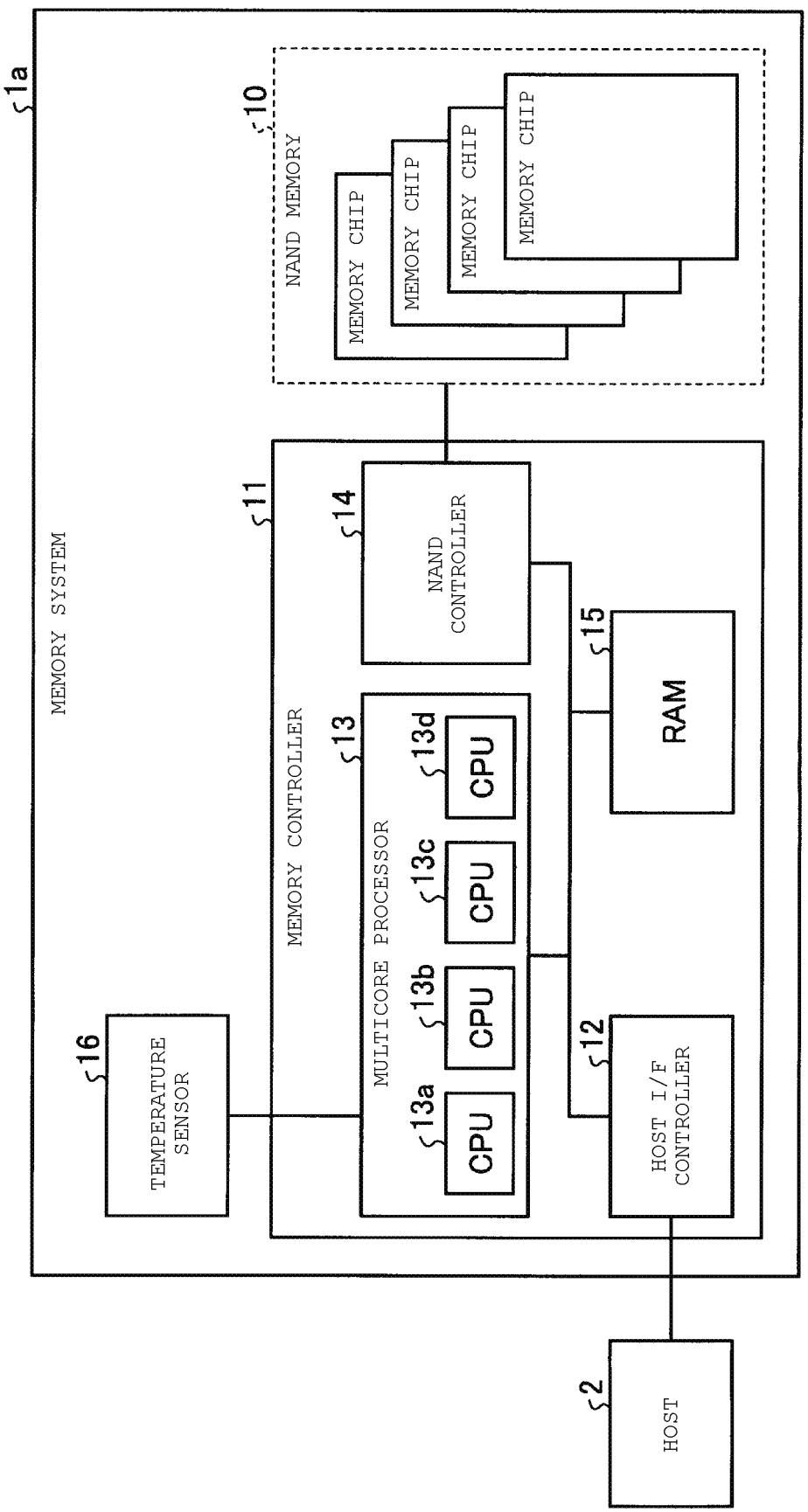
FIG. 1 is a diagram illustrating a configuration example of a memory system of some embodiments.

FIG. 1 is a diagram illustrating a configuration example of a memory system of some embodiments. A memory system 1a may be connected to a host 2 through a predetermined communication interface. The host 2, for example, may correspond to a personal computer, a portable information terminal, a server, and the like. The memory system 1a can receive an access request (e.g., read request and write request) from the host 2. Each access request may be accompanied by a logical address indicating an access destination. The logical address may indicate a position in a logical address space provided from the memory system 1a to the host 2. The memory system 1a may receive data to be written together with the write request.

The memory system 1a may include a NAND type flash memory (or NAND memory) 10 and a memory controller 11 that performs data transmission between the host 2 and the NAND memory 10. The memory system 1a may include an arbitrary nonvolatile memory instead of the NAND memory 10. For example, the memory system 1a may include a NOR type flash memory instead of the NAND memory 10.

The NAND memory 10 may include one or more memory chips. Each memory chip may include a plurality of blocks. The block, for example, may be a minimal storage region where data can be erased. The block may include a plurality of pages. The page, for example, may be a minimal storage region where data can be read or written.

The memory system 1a may include a temperature sensor 16 that detects the temperature of the memory system 1a. A detection value by the temperature sensor 16 may be sent to the memory controller 11.

The memory controller 11 may include a host interface controller (host I/F controller) 12, a multicore processor 13, a NAND controller 14, and a RAM (Random Access Memory) 15.

The multicore processor 13 may control the memory controller 11 based on a firmware program. The firmware program, for example, may be stored in advance in a nonvolatile memory such as the NAND memory 10, may be read from the NAND memory 10 at the time of startup, and may be executed by the multicore processor 13.

The host I/F controller 12 may control a communication interface with the host 2. The host I/F controller 12 may perform data transmission between the host 2 and the RAM 15 under the control by the multicore processor 13. The NAND controller 14 may perform data transmission between the NAND memory 10 and the RAM 15 under the control by the multicore processor 13.

The multicore processor 13 may include a plurality of processors (e.g., CPUs 13). As an example, the multicore processor 13 may include a CPU 13a, a CPU 13b, a CPU 13c, and a CPU 13d.

Figure 2:
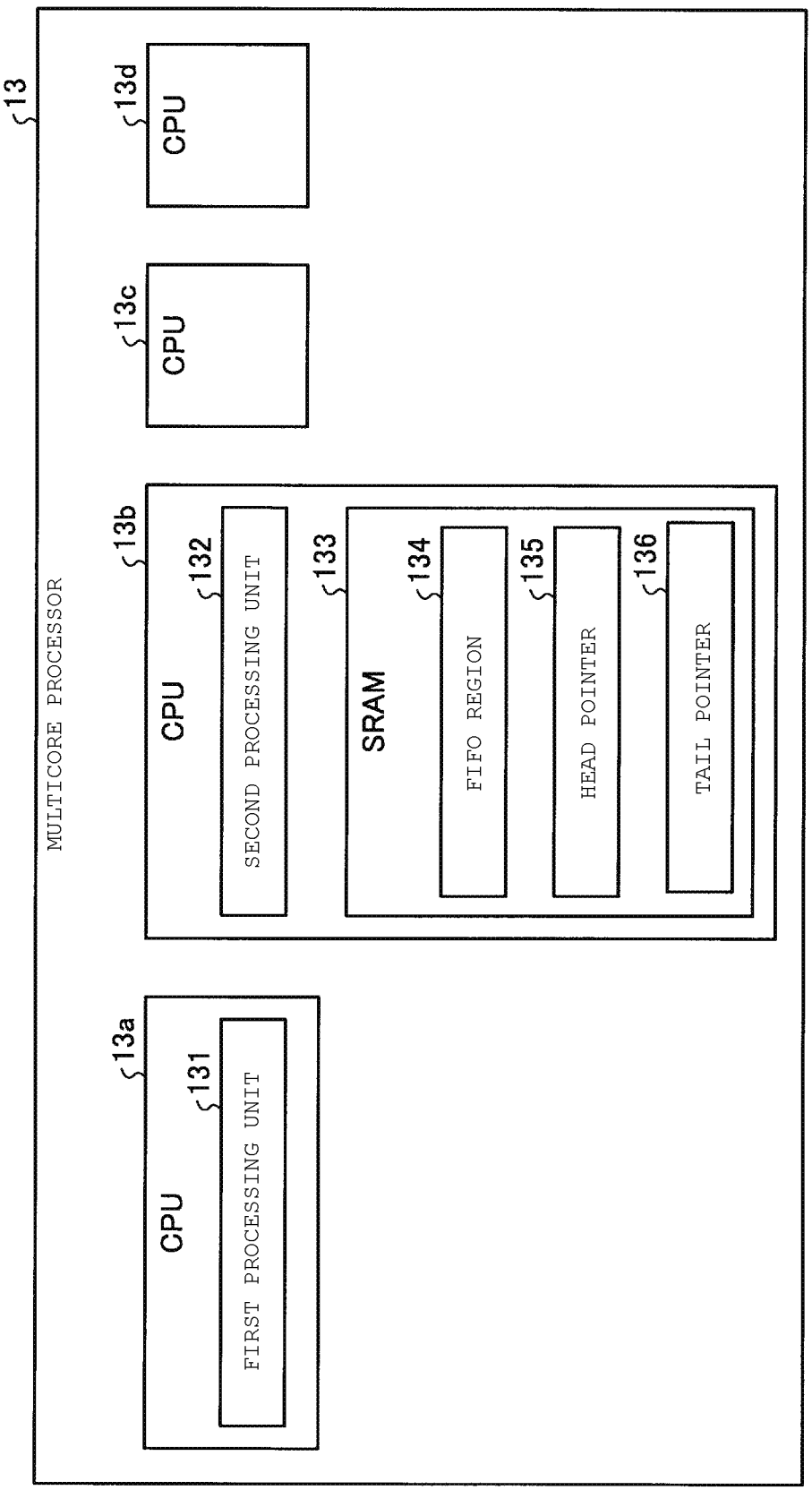
FIG. 2 is a diagram illustrating a more detailed configuration of a multicore processor of some embodiments.

FIG. 2 is a diagram illustrating a more detailed configuration of the multicore processor 13. The control of the memory controller 11 may be divided into a plurality of processes and may be shared by the four CPUs 13. The plurality of processes constituting the control of the memory controller 11, for example, may include a process for receiving a request from the host 2, a process for correlating a logical address included in the access request with a physical position (e.g., a physical address) in the NAND memory 10, a process for generating data in units of pages to be written in the NAND memory 10 from write target data sent from the host 2, a process for generating data to be sent to the host 2 from the data in units of pages read from the NAND memory 10, and a process for accessing the NAND memory 10.

In some embodiments, the CPU 13a may serve as a first processing unit 131 that performs the process for receiving a request from the host 2 among the plurality of processes constituting the control of the memory controller 11. The CPU 13b may serve as a second processing unit 132 that performs the process for accessing the NAND memory 10.

Access to the NAND memory 10 may include a plurality of types of access. The plurality of types may include read, write, and erase. When data is read from the NAND memory 10, the second processing unit 132 may transmit a read command including a physical address for designating a page of a read source to the NAND memory 10 via the NAND controller 14. In some embodiments, when data is written in the NAND memory 10, the second processing unit 132 may transmit a write command including a physical address for designating a page of a write destination to the NAND memory 10 via the NAND controller 14. In some embodiments, when erase is performed for the NAND memory 10, the second processing unit 132 may transmit an erase command including a physical address for designating a block to be erased to the NAND memory 10 via the NAND controller 14.

The first processing unit 131 may set credits. Setting the credits may be to supply credits to the second processing unit 132. The credit may be an amount in accordance with an operation time of the NAND memory 10, and supplying the credit may be to assign the amount in accordance with the operation time of the NAND memory 10. The credit can be written in an arbitrary unit as long as it corresponds to the operation time of the NAND memory 10. For example, the credit may be written by a "point" of an integer value linearly corresponding to the operation time of the NAND memory 10.

The second processing unit 132 may perform access to the NAND memory 10 while consuming the supplied credit. In other words, the second processing unit 132 may employ the amount in accordance with the operation time of the NAND memory 10 in the access as a consumed amount of the supplied credit. When the credit is exhausted, that is, when a consumed amount of the credit reaches a supply amount of the credit, the second processing unit 132 may transmit an exhaustion notification indicating the exhaustion of the credit to the first processing unit 131.

When the exhaustion notification is received, the first processing unit 131 can limit the operation of the NAND memory 10. As an example of the operation limitation of the NAND memory 10, the first processing unit 131 may cause an operation mode of the CPU 13b to be transitioned from a normal mode to a snooze mode. In some embodiments, the normal mode may be a mode in which access to the NAND memory 10 is possible, and the snooze mode is a mode in which access to the NAND memory 10 is not possible. For example, in the snooze mode, a clock supplied to the CPU 13b may be blocked. When the operation mode of the CPU 13b is transitioned from the normal mode to the snooze mode, it is possible that the second processing unit 132 is not able to access the NAND memory 10, and thus performance of the memory system 1a can be suppressed.

When the first processing unit 131 decreases the supply amount of the credit, a credit in the second processing unit 132 may be easily exhausted. As a consequence, the NAND memory 10 may have a tendency toward suppression of its operation. In contrast, when the first processing unit 131 increases the supply amount of the credit, a credit in the second processing unit 132 may be difficult to be exhausted. As a consequence, the NAND memory 10 may have a tendency toward less suppression of its operation. That is, the first processing unit 131 can adjust the supply amount of the credit, thereby adjusting the performance of the memory system 1a.

An adjustment method of the supply amount of the credit is not limited to a specific method. As an example, when the supply amount of the credit is calculated, the first processing unit 131 may feedback a detection value by the temperature sensor 16. The first processing unit 131 may perform arithmetic calculation based on proportional-integral-derivative (PID) control by using the detection value by the temperature sensor 16 as a feedback, thereby calculating the supply amount of the credit such that the detection value of the temperature sensor 16 does not exceed a target temperature.

The first processing unit 131 may supply credits a plurality of times at timings different from one another. Each of the supplied credits may have an expiration date. The second processing unit 132 may consume credits in order from credits which have earlier expiration dates among the credits supplied a plurality of times. It is possible that the second processing unit 132 is not able to use credits having the expiration dates expired. The expiration dates may be added to the credits, so that the following property of performance for adjustment of the supply amount of the credit can be improved.

In some embodiments, credits may not always be set a plurality of times. In some embodiments, the expiration dates may not be set in credits.

A management method of the expiration dates is not limited to a specific method. As an example, the second processing unit 132 may treat each of the predetermined number of credits finally supplied among a plurality of supplied credits as credits having the expiration dates not expired, and treat all the other credits as credits having the expiration expired.

The CPU 13b may include a static RAM (SRAM) 133 accessible from the CPU 13a. The SRAM 133 may be provided with a FIFO region 134 as a memory region for supplying credits. In the FIFO region 134, credits may be recorded in a supplied order. In the SRAM 133, a head pointer 135 and a tail pointer 136, which are pointers for managing the FIFO region 134, may be further recorded.

Figure 3:
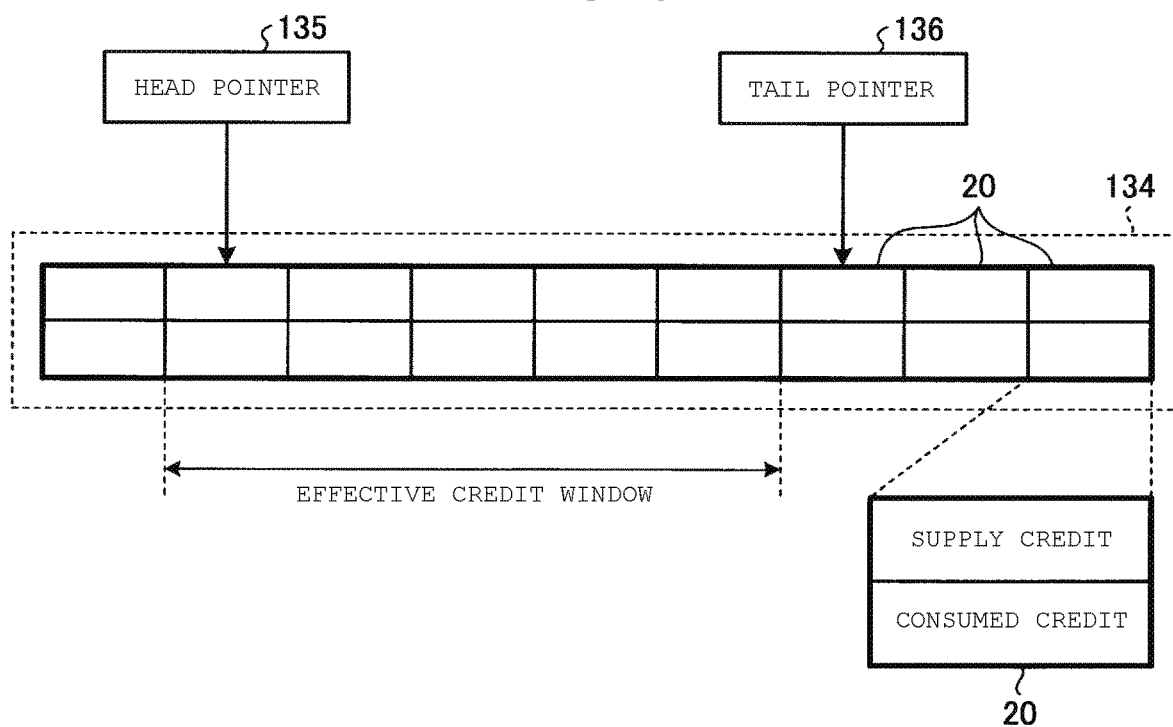
FIG. 3 is a schematic diagram illustrating a configuration example of a first-in-first-out (FIFO) region of some embodiments.

FIG. 3 is a schematic diagram illustrating a configuration example of the FIFO region 134. The FIFO region 134 may include a plurality of unit regions 20 which are logically arranged in a ring shape and in which data is written in a chronological order. Each unit region 20 may include a region where an amount (e.g., supply credits) of supplied credits can be recorded and a region where an amount (e.g., consumed credits) of consumed credits can be recorded. The supply credits may be input by the first processing unit 131 according to a FIFO (First In, First Out) rule. The consumed credits may be input or updated by the second processing unit 132 according to consumption of credits.

The tail pointer 136 may be a pointer indicating unit regions 20 where supply credits are to be recorded next time. The first processing unit 131 may record supply credits in unit regions 20 indicated by the tail pointer 136, and update the tail pointer 136 such that unit regions 20 with the oldest supply credits recorded therein are indicated.

The head pointer 135 may be a pointer indicating a unit region 20 where a supply credit, which has the earliest expiration date among a plurality of supply credits having the expiration dates not expired, is recorded. The second processing unit 132 may cause the head pointer 135 to follow the tail pointer 136 in the predetermined number of (e.g., five as shown in FIG. 3) unit regions 20

Supply credits, which are recorded in unit regions 20 indicated by the head pointer 135, and all supply credits, which are recorded later in time than the supply credits recorded in the unit regions 20 indicated by the head pointer 135, may correspond to credits having the expiration dates not expired (e.g., may have expiration dates that are not expired). That is, all supply credits, which are written from the unit regions 20 indicated by the head pointer 135 to unit regions 20 indicated immediately before the tail pointer 136 is finally updated, may correspond to credits having the expiration dates not expired (e.g., may have expiration dates that are not expired). In the following, a range from the unit regions 20 indicated by the head pointer 135 to the unit regions 20 indicated immediately before the tail pointer 136 is finally updated is written as an effective credit window.

The second processing unit 132 may consume supply credits which have earlier expiration dates among a plurality of supply credits recorded in the effective credit window.

FIG. 4 to FIG. 9 are diagrams for explaining an example of transition of a state of data recorded in the FIFO region 134.

Figure 4:
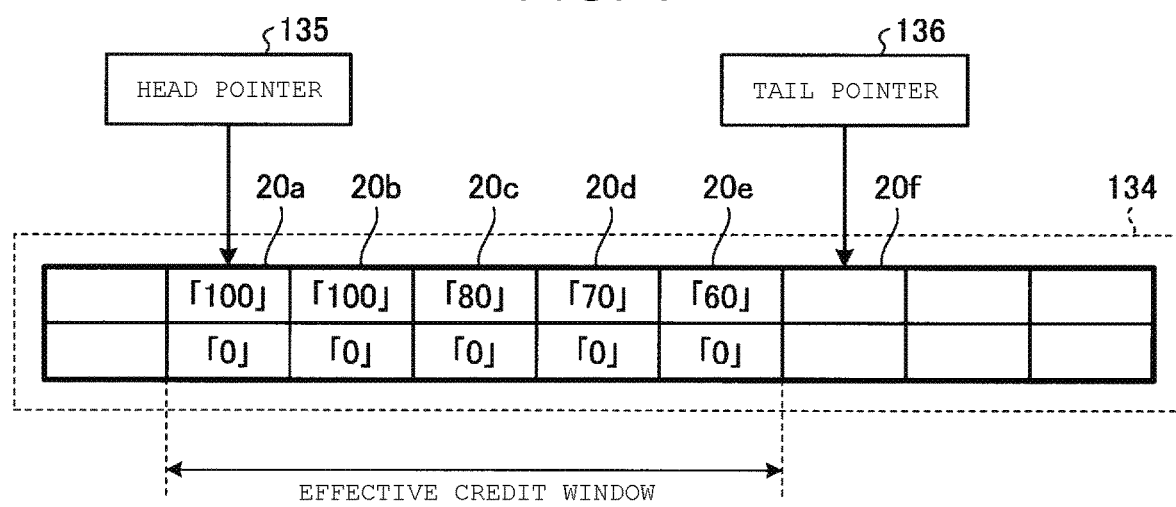
FIG. 4 is a diagram for explaining an example of a state of data recorded in a FIFO region of some embodiments.

For example, as illustrated in FIG. 4, unit regions 20a to 20e may be included in the effective credit window. Supply credits may be recorded in respective unit regions 20 in an order of the unit regions 20a, 20b, 20c, 20d, and 20e. For example, a supply credit of a point "100" is recorded in the unit region 20a, the supply credit of the point "100" is recorded in the unit region 20b, a supply credit of a point "80" is recorded in the unit region 20c, a supply credit of a point "70" is recorded in the unit region 20d, and a supply credit of a point "60" is recorded in the unit region 20e. In some embodiments, in each of the unit regions 20a to 20e, a consumed credit of a point "0" is recorded. That is, consumption of all the supply credits recorded in the unit regions 20a to 20e is not completed, while credits of a point "410", which is the total value of the supply credits recorded in the unit regions 20a, 20b, 20c, 20d, and 20e, are available.

When the second processing unit 132 performs access, the second processing unit 132 may consume supply credits, which have the earliest expiration dates among the available credits of the point "410". For example, in the state in which data recorded in the FIFO region 134 is illustrated in FIG. 4, when the second processing unit 132 performs access corresponding to a point "50", the second processing unit 132 may consume supply credits recorded in the unit region 20a, which are supply credits having the earliest expiration dates among supply credits included in the effective credit window and are not completely consumed. That is, the second processing unit 132 may update the consumed credits recorded in the unit region 20a from the point "0" to the point "50". By this update, the data recorded in the FIFO region 134 can enter the state illustrated in FIG. 5. In this state, credits of a point "360" are available.

Subsequently, when the second processing unit 132 performs access corresponding to the point "70", the second processing unit 132 may consume the non-consumed point "50" among the supply credits recorded in the unit region 20a. Then, the second processing unit 132 may consume a remaining point "20" from the supply credits recorded in the unit region 20b having the second-earliest expiration date among the supply credits recorded in the unit region 20a. That is, the second processing unit 132 may update the consumed credits recorded in the unit region 20a from the point "50" to the point "100" and updates the consumed credits recorded in the unit region 20b from the point "0" to the point "20". By this update, the data recorded in the FIFO region 134 can enter the state illustrated in FIG. 6. In this state, credits of a point "290" are available.

Subsequently, when the first processing unit 131 supplies credits of the point "50", the first processing unit 131 may record "50" in a unit region 20f indicated by the tail pointer 136 as supply credits, and update the tail pointer 136. The second processing unit 132 may update the head pointer 135 according to the update of the tail pointer 136. By this update, the data recorded in the FIFO region 134 can enter the state illustrated in FIG. 7. By this update, the supply credits recorded in the unit region 20a may be excluded from the effective credit window. That is, the expiration dates of the supply credits recorded in the unit region 20a are expired. In some embodiments, the supply credits recorded in the unit region 20f may be added to the effective credit window. In this way, in the state illustrated in FIG. 7, credits of a point "340" are available.

Figure 7:
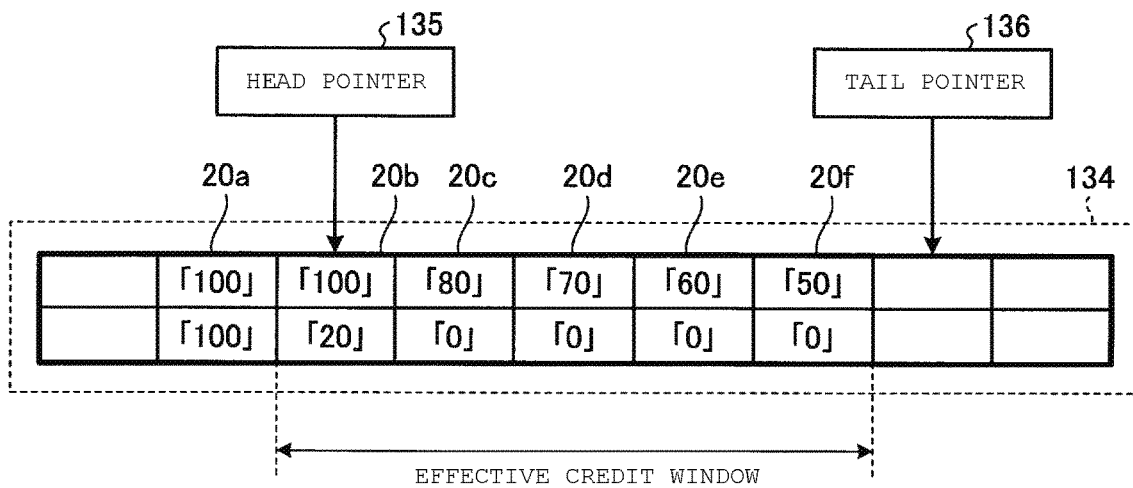
FIG. 7 is a diagram for explaining an example of still another state of data recorded in the FIFO region of some embodiments.
Figure 8:
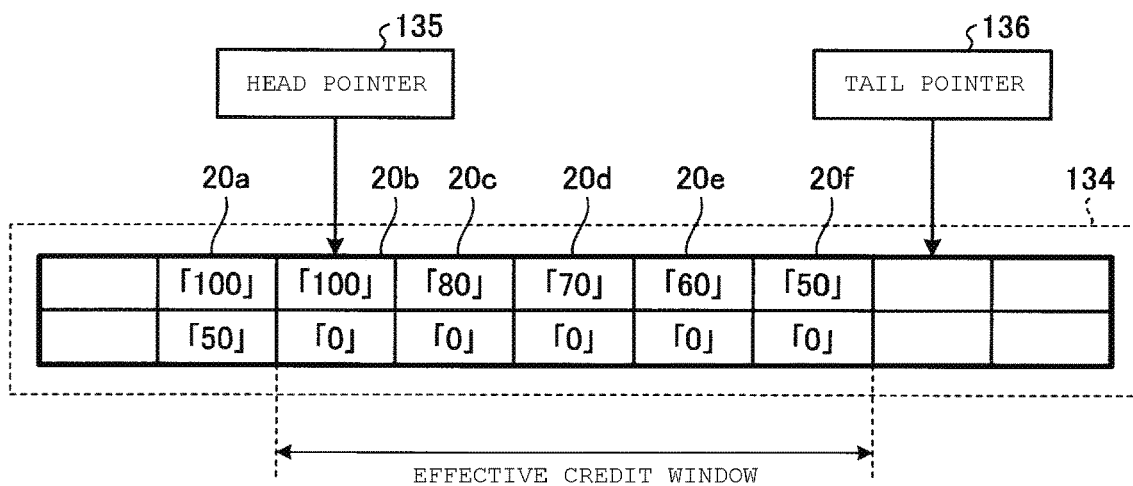
FIG. 8 is a diagram for explaining an example of still another state of data recorded in the FIFO region of some embodiments.

In the example of FIG. 7, consumption of the supply credits recorded in the unit region 20a is completed. The expiration dates of the supply credits can be expired even when the consumption of the supply credits is not completed. For example, when the data recorded in the FIFO region 134 enters the state illustrated in FIG. 5 and the credits of the point "50" are newly supplied, the unit region 20a may be excluded from the effective credit window in the state in which the point "50" of the supply credits recorded in the unit region 20a is not consumed as illustrated in FIG. 8.

In some embodiments, in each unit region 20, after the recorded supply credits are expired (e.g., the expiration dates of the recorded supply credits are reached), the supply credits and the consumed credits may be overwritten to "0", respectively. In some embodiments, in each unit region 20, when supply credits are newly recorded, the new supply credits may be overwritten and the consumed credits may be overwritten to "0".

Figure 9:
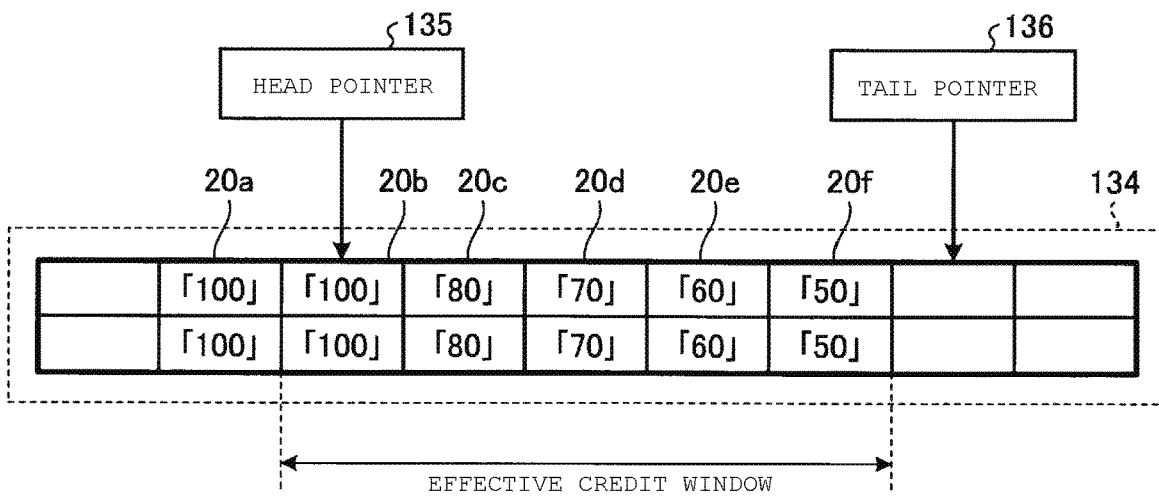
FIG. 9 is a diagram for explaining an example of still another state of data recorded in the FIFO region of some embodiments.

When the data recorded in the FIFO region 134 enters the state illustrated in FIG. 7 and the credits of the point "340" are newly consumed, the data recorded in the FIFO region 134 can enter the state illustrated in FIG. 9 by updating the consumed credits by the aforementioned method. By this update, in all the unit regions 20 included in the effective credit window, the supply credits and the consumed credits may be equal to each other. When the data recorded in the FIFO region 134 is in such a state, the second processing unit 132 may determine that the supply credits are exhausted and may transmit an exhaustion notification to the first processing unit 131.

Figure 10:
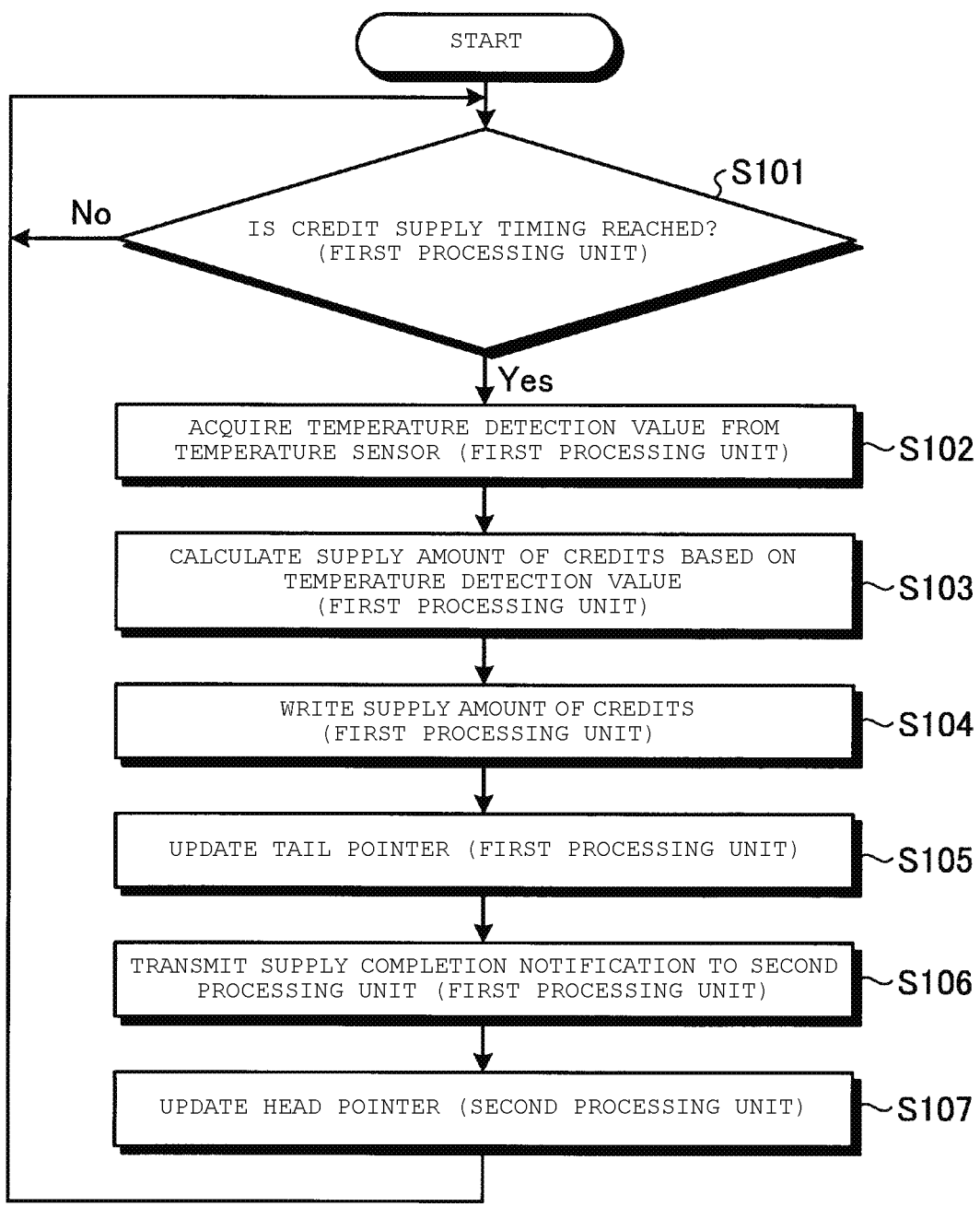
FIG. 10 is a flowchart for explaining an operation of the memory system of some embodiments when a credit is supplied in a normal mode.

Next, the operation example of the memory system 1a of some embodiments will be described. FIG. 10 is a flowchart for explaining an operation at the time of supply of credits in the normal mode.

In the normal mode, as illustrated in FIG. 10, the first processing unit 131 may determine whether a credit supply timing is reached (S101). When it is determined that the credit supply timing is not reached (No in S101), the process of S101 may be performed again.

The credit supply timing can be arbitrarily set. For example, when a predetermined time has passed (or has elapsed) from the supply of credits of previous time, the first processing unit 131 may determine that the credit supply timing is reached, and when the predetermined time has not passed from the supply of credits of previous time, the first processing unit 131 may determine that the credit supply timing is not reached. In some embodiments, in a case where credits are not supplied even once, when the predetermined time has passed from the start of the operation, the first processing unit 131 may determine that the credit supply timing is reached. In some embodiments, in the case where credits are not supplied even once, the first processing unit 131 may determine that the credit supply timing is reached, regardless of the passage time.

When the first processing unit 131 determines that the credit supply timing is reached (Yes in S101), the first processing unit 131 may acquire a temperature detection value from the temperature sensor 16 (S102). Then, the first processing unit 131 may calculate a supply amount (supply credits) of credits based on the temperature detection value (S103).

In the process of S103, the first processing unit 131, for example, may calculate the supply amount of credits by using the following Equation 1. This Equation 1 is an example of an Equation for obtaining the supply amount of credits by arithmetical calculation based on PID control.

$$\text{Credit}(n) = \text{Credit}(n-1) + Kp^*(e(n)-e(n-1)) + Ki^*e(n) + Kd^*((e(n)-e(e-1))-(e(n-1)-e(n-2)))$$ (Equation 1)

When a loop counter of the loop process of S101 to S107 is written as "i (e.g., i is an integer equal to or more than 0)", Credit(i) is a supply amount of credits which is calculated in an $i+1^{th}$ loop process, and e (i) is a value which is calculated in the $i+1^{th}$ loop process and is obtained by subtracting the temperature detection value from a target temperature. Furthermore, Kp is a proportional coefficient, Ki is an integration coefficient, and a Kd is a differential coefficient. Each of Kp, Ki, and Kd is determined by tuning, namely adjustment of these coefficients to attain a target response. The target temperature, for example, may be determined by specifications in advance.

According to Equation 1, in the loop processes of first two times, Credit(n−1), e(n−1), and e(n−2) are not determined. In such a case, in an example, the first processing unit 131 may use values determined in advance as Credit(n−1), e(n−1), and e(n−2).

The first processing unit 131 may write the supply credits obtained by the process of S103 in the FIFO region 134 (S104). The write position of the supply credits may be the unit region 20 indicated by the tail pointer 136. The first processing unit 131 may update the tail pointer 136 according to the execution of the process of S103 (S105).

Subsequently, the first processing unit 131 may transmit a supply completion notification to the second processing unit 132 (S106). The supply completion notification, for example, may be transmitted using inter-processor communication. When the supply completion notification is received, the second processing unit 132 may recognize that the supply credits are written in the FIFO region 134. Then, the second processing unit 132 may update the head pointer 135 (S107). After the process of S107, the control may proceed to S101.

Figure 11:
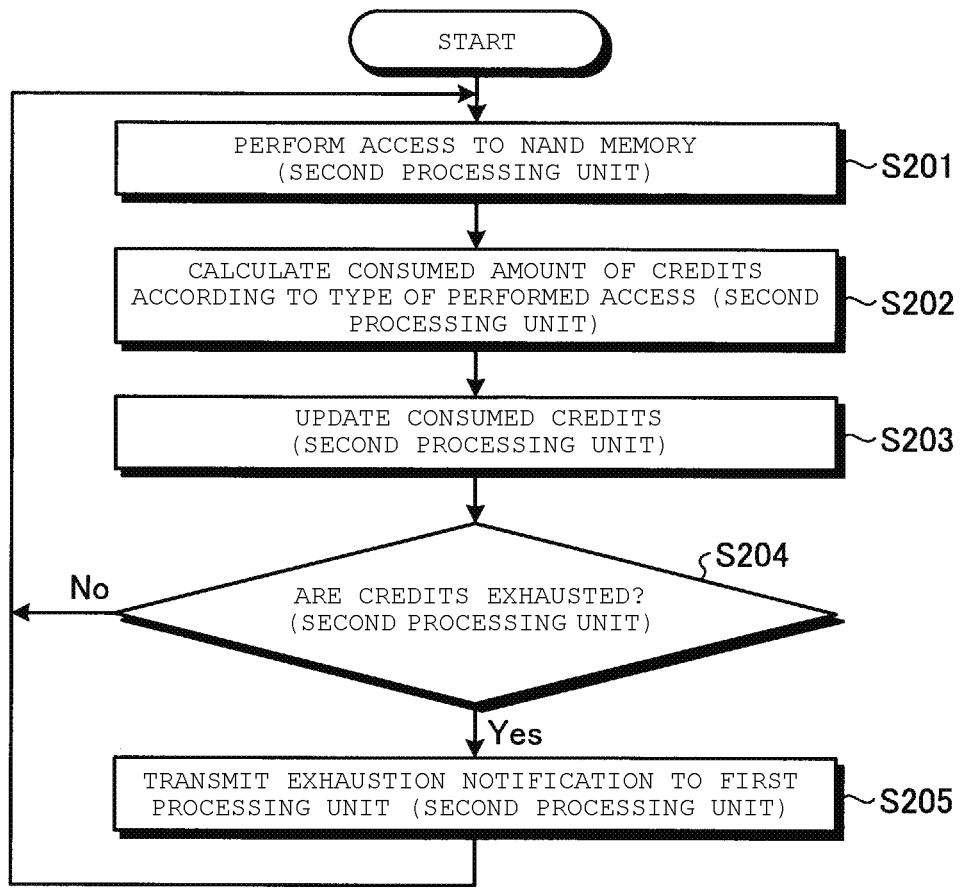
FIG. 11 is a flowchart for explaining an operation of the memory system of some embodiments when a credit is consumed in a normal mode.

FIG. 11 is a flowchart for explaining an operation at the time when a credit is consumed in the normal mode.

When the second processing unit 132 performs access to the NAND memory 10 (S201), the second processing unit 132 may calculate the consumed amount of credits according to the type of the performed access (S202).

The operation times of the NAND memory 10 at the time of read, write, and erase may be roughly determined. Consequently, credits required for each read, each write, and each erase may be obtained and stored in advance, so that it is possible to estimate the consumed amount of credits without actually measuring the operation times of the NAND memory 10. In an example, a unit consumed amount of credits may be stored in correlation with the type of an access command. For example, in a case where a unit consumed amount of credits related to a read command is a point "5", a unit consumed amount of credits related to a write command is a point "20", and a unit consumed amount of credits related to an erase command is a point "100", when the second processing unit 132 issues six read commands in the process of S201, the second processing unit 132 may calculate a consumed amount "30" of credits by multiplying the unit consumed amount "5" of credits related to a read command by the number "6" of the read command. As described above, the second processing unit 132 can calculate a consumed amount of credits without actually measuring the operation times of the NAND memory 10.

In some embodiments, the second processing unit 132 may actually measure the operation times of the NAND memory 10. In an example, the second processing unit 132 may monitor a ready/busy signal of the NAND memory 10, issue an access command, and then count (or measure) a time (e.g., a busy time) from transitioning, based on the ready/busy signal, from a busy state to a ready state. Then, the second processing unit 132 may employ the obtained busy time as a consumed amount of credits.

An order of the process of S201 and the process of S202 is not limited to the above. For example, when an access command to be issued is determined, the second processing unit 132 may calculate a consumed amount of credits before the access command to be issued is issued.

Based on the consumed amount of credits obtained in the process of S202, the second processing unit 132 may update the consumed credits recorded in the FIFO region 134 (S203). An update method of the consumed credits is as described above.

When available credits are smaller than the consumed amount of credits obtained in the process of S202, the second processing unit 132 may regard (or set) the total amount of the available credits as the consumed amount of credits and update the consumed credits in an example.

Subsequently, the second processing unit 132 may determine whether the credits are exhausted (S204). When the second processing unit 132 determines that the credits are exhausted (Yes in S204), the second processing unit 132 may transmit an exhaustion notification to the first processing unit 131 (S205). The exhaustion notification, for example, may be transmitted using inter-processor communication. After the process of S205, the control may proceed to the process of S201. When the second processing unit 132 determines that the credits are not exhausted (No in S204), the process of S205 may be skipped (or omitted).

Figure 12:
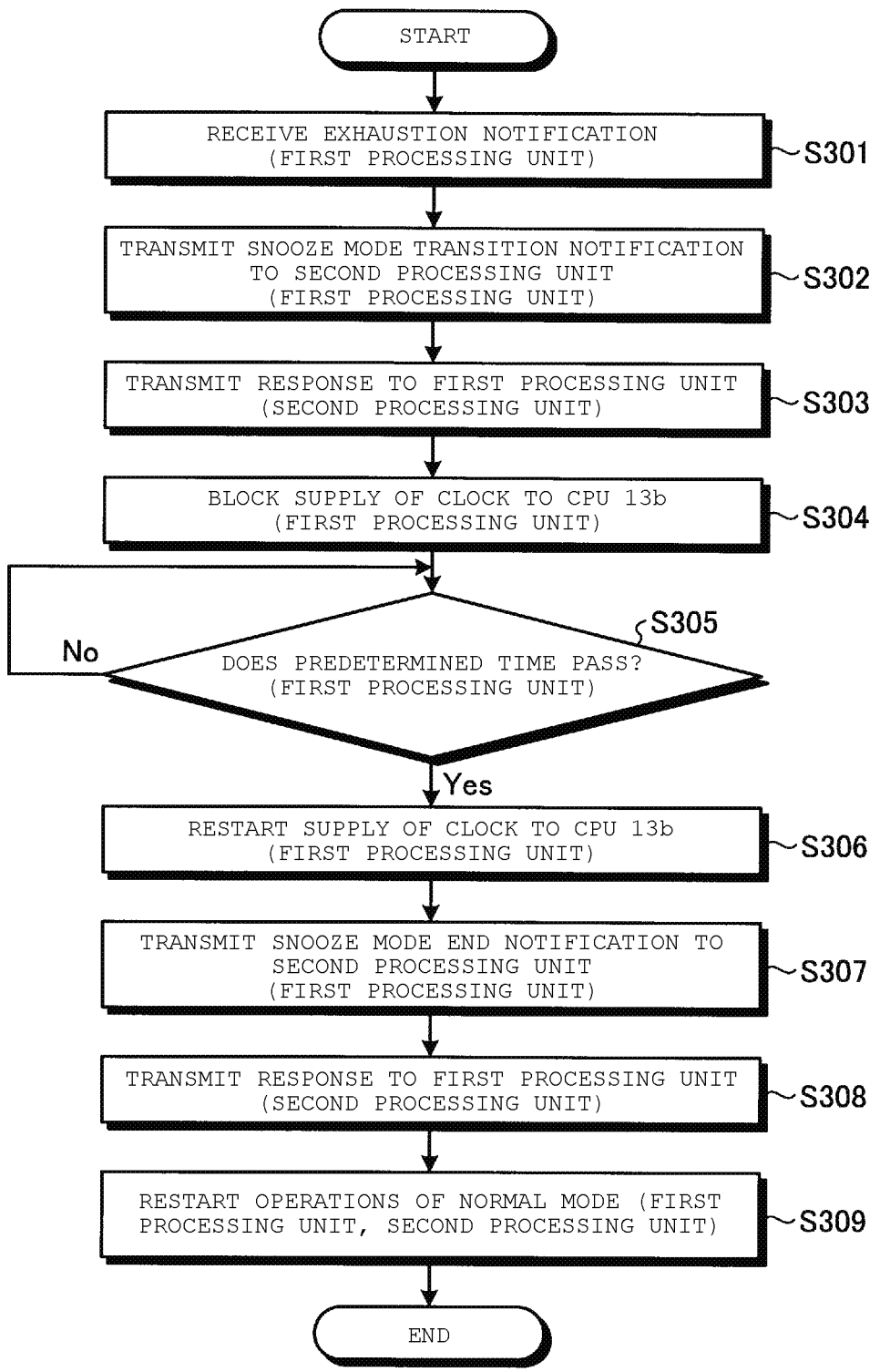
FIG. 12 is a flowchart for explaining a switching operation of an operation mode of the memory system of some embodiments.

FIG. 12 is a flowchart for explaining a switching operation of the operation mode.

When the exhaustion notification is received (S301), the first processing unit 131 may transmit a snooze mode transition notification to the second processing unit 132 (S302). The snooze mode transition notification, various responses to be described later, and a snooze mode end notification to be described later, for example, may be transmitted using inter-processor communication.

When the snooze mode transition notification is received, the second processing unit 132 may wait until the process of the CPU 13b is settled, and transmit a response to the first processing unit 131 after the process of the CPU 13b is settled (S303).

When the response is received, the first processing unit 131 may block the supply of a clock to the CPU 13b (S304). In this way, the CPU 13b may lose a function as the second processing unit 132 so that CPU 13b is not able to access the NAND memory 10.

The first processing unit 131 may determine whether a predetermined time has passed after the process of S304 is performed (S305). When the first processing unit 131 determines that the predetermined time has not passed after the process of S304 is performed (No in S305), the first processing unit 131 may perform the process of S305 again.

When the first processing unit 131 determines that the predetermined time has passed after the process of S304 is performed (Yes in S305), the first processing unit 131 may restart the supply of a clock to the CPU 13b (S306). Then, the first processing unit 131 may transmit the snooze mode end notification to the second processing unit 132 (S307).

When the snooze mode end notification is received, the second processing unit 132 may perform a returning process. After the returning process is completed, the second processing unit 132 may transmit a response to the first processing unit 131 (S308).

After transmitting the response, the second processing unit 132 may restart the operations of the normal mode (S309). In some embodiments, after receiving the response, the first processing unit 131 may start the operations of the normal mode (S309). Then, the process may end.

As described above, according to some embodiments, the first processing unit 131 may calculate supply credits which are an assignment amount of credits. The credits may be an amount according to the operation times of the NAND memory 10. When accessing the NAND memory 10, the second processing unit 132 may calculate consumed credits which are an amount according to the operation times of the NAND memory 10 in the access. When the consumed amount of credits reaches the assignment amount of credits, the second processing unit 132 may transmit an exhaustion notification to the first processing unit 131.

The first processing unit 131 can provide the exhaustion notification in determination regarding whether to limit the access to the NAND memory 10. In such a case, adjusting the supply credits may be performed by adjustment of a time at which the access to the NAND memory 10 can be performed. Thus, it is possible to simply adjust performance.

Furthermore, the operation times of the NAND memory 10 may have a large influence on a temperature and power consumption. Thus, the supply amount of credits may be adjusted, so that it is possible to adjust the temperature and the power consumption. That is, it is possible to simply adjust the temperature and the power consumption.

In some embodiments, the first processing unit 131 may set supply credits a plurality of times at timings different from one another. Each of the supply credits may have an expiration date. When consumed credits reach the total amount of one or more supply credits having the expiration dates not expired, the second processing unit 132 may transmit an exhaustion notification. The expiration dates may be set in the supply credits, so that non-consumed supply credits are prevented from being indefinitely kept. As a consequence, a following property of performance for the adjustment of supply credits can be improved.

In some embodiments, the memory system 1a may include the temperature sensor 16. The first processing unit 131 may calculate respective supply credits according to the temperature detection value by the temperature sensor 16. Thus, it is possible to adjust performance such that the temperature of the memory system 1a does not excessively rise.

The temperature detection value by the temperature sensor 16 is an example of information indicating the usage conditions of the memory system 1a. The first processing unit 131 may use other types of information indicating the usage conditions of the memory system 1a, instead of the detection value by the temperature sensor 16. The other types of information indicating the usage conditions of the memory system 1a, for example, is power consumption of the memory system 1a.

In some embodiments, the first processing unit 131 may calculate supply credits based on arithmetical calculation of PID control in which the temperature detection value by the temperature sensor 16 is employed as feedback input. Thus, by tuning the proportional coefficient, the differential coefficient, and the integration coefficient, high performance temperature control is possible such as preventing the temperature detection value by the temperature sensor 16 from overshooting the target temperature.

In some embodiments, the first processing unit 131 may perform arithmetical calculation based on another type of arbitrary feedback control such as proportional integral (PI) control, instead of the PID control. In some embodiments, the first processing unit 131 may calculate supply credits by an arithmetic methodology other than the feedback control.

In some embodiments, the first processing unit 131 may calculate the supply amount of credits by using information other than the information indicating the usage conditions of the memory system 1a. For example, the first processing unit 131 may receive request performance from an exterior (for example, the host 2), and calculate supply credits such that the performance of the memory system 1a does not exceed the received request performance.

In some embodiments, the first processing unit 131 may cause the second processing unit 132 to be transitioned to a mode, in which the access to the NAND memory 10 is not performed, according to the reception of the exhaustion notification. Thus, performance can be suppressed according to the exhaustion of supply credits.

In some embodiments, the access to the NAND memory 10 may include a plurality of types of access including read, write, and erase, and the second processing unit 132 may calculate consumed credits according to the type of the access. Since it is not necessary to actually measure the operation times of the NAND memory 10, it is possible to calculate consumed credits with a streamlined methodology.

In some embodiments, the CPU 13b may include the FIFO region 134 managed by the FIFO rule. The first processing unit 131 may sequentially write each supply credit in the FIFO region. The second processing unit 132 may regard (or set) each of the predetermined number of supply credits finally written as a supply credit having the expiration date not expired. Thus, expiration dates can be managed with a streamlined methodology.

In some embodiments, a position in which the FIFO region 134 is provided is not limited only to the interior of the CPU 13b. The FIFO region 134 may be provided in the CPU 13a, or may be provided to an exterior (for example, the RAM 15) of the multicore processor 13.

In some embodiments, in each unit region 20 constituting the FIFO region 134, a pair of supply credits and consumed credits may be recorded. Each pair recorded in the FIFO region 134 may be referred to from an exterior. In such a case, it is possible to provide each pair in failure analysis. In some embodiments, each pair may be chronologically maintained in a nonvolatile way.

In some embodiments, after the second processing unit 132 is transitioned to the snooze mode and then a predetermined time passes, the first processing unit 131 may cause the second processing unit 132 to be transitioned to the normal mode. Thus, performance can be adjusted with a streamlined methodology.

In some embodiments, the snooze mode may be a mode in which the supply of a clock to the CPU 13b is blocked. The first processing unit 131 may prohibit the execution of the access to the NAND memory 10 by methods other than the block of clock supply.

Figure 13:
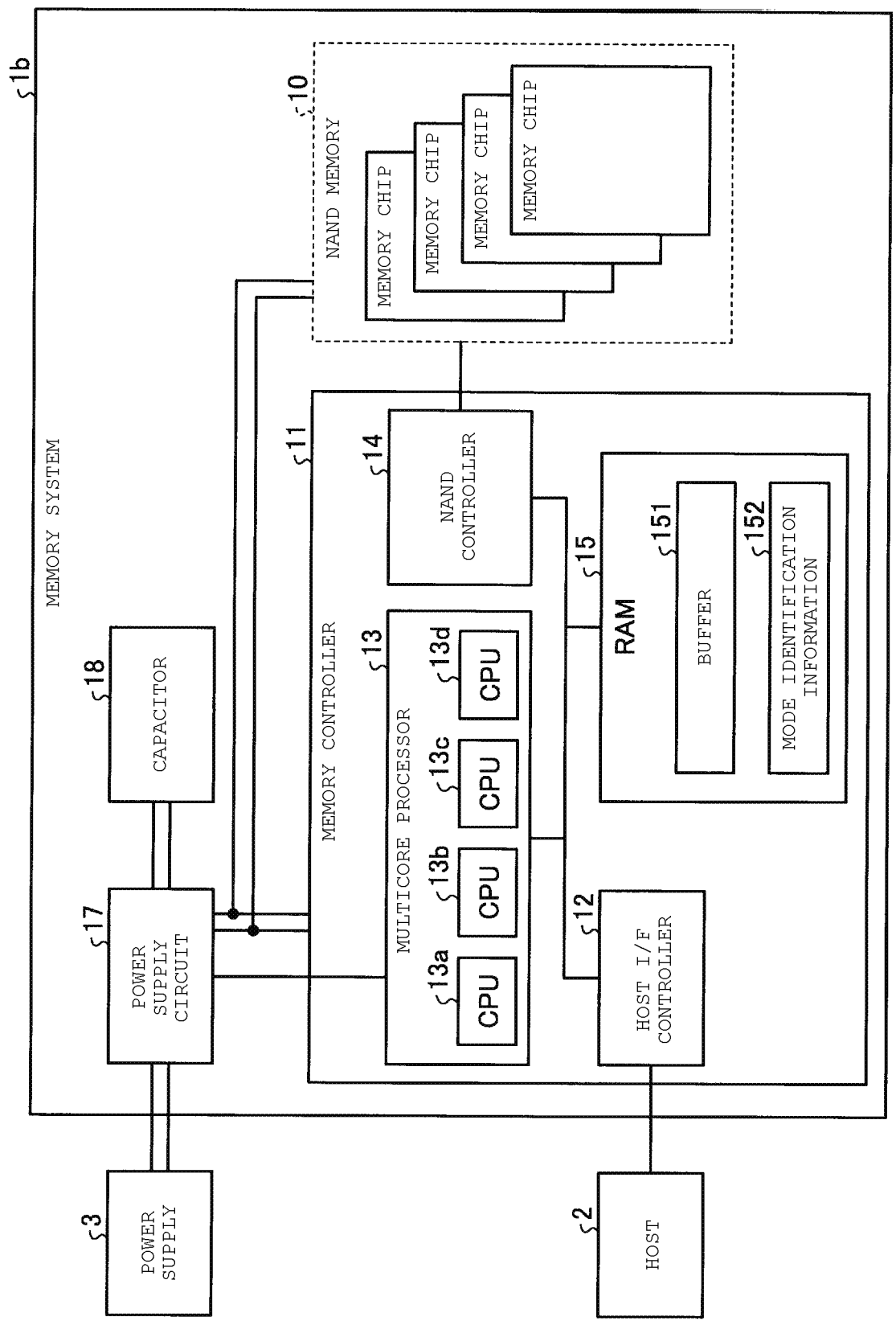
FIG. 13 is a diagram illustrating a configuration example of a memory system of some embodiments.

FIG. 13 is a diagram illustrating a configuration example of a memory system of some embodiments. A memory system 1b may be connected to the host 2 through a predetermined communication interface. The host 2, for example, may be a personal computer, a portable information terminal, a server, and the like. The memory system 1b may be connected to a power supply 3 outside the memory system 1b, and power may be supplied from the power supply 3. The memory system 1b may operate by using the power from the power supply 3. The memory system 1b can receive an access request (e.g., read request and write request) from the host 2. Each access request may be accompanied by a logical address indicating an access destination. The logical address may indicate a position in a logical address space provided from the memory system 1b to the host 2. The memory system 1b may receive data to be written together with the write request.

The memory system 1b may include the NAND type flash memory (NAND memory) 10 and the memory controller 11 that performs data transmission between the host 2 and the NAND memory 10. The memory system 1b may include an arbitrary nonvolatile memory instead of the NAND memory 10. For example, the memory system 1b may include a NOR type flash memory instead of the NAND memory 10.

The NAND memory 10 may include one or more memory chips. Each block may include a plurality of blocks. The block, for example, may be a minimal storage region where data can be erased. The block may include a plurality of pages. The page, for example, may be a minimal storage region where data can be read or written.

The memory system 1b further may include a power supply circuit 17 and a capacitor 18.

The power supply circuit 17 may convert the power supplied from the power supply 3 and supplies the converted power to the NAND memory 10 and the memory controller 11, or may supply the power supplied from the power supply 3 to the NAND memory 10 and the memory controller 11 as is. The NAND memory 10 and the memory controller 11 may operate by using the power supplied from the power supply circuit 17.

The capacitor 18 may be a chargeable battery. When power is supplied from the power supply 3, the capacitor 18 may be charged by the power supply circuit 17. At the time of power shutdown, a power supply source may be switched from the power supply 3 to the capacitor 18 by the power supply circuit 17, and power may be supplied from the capacitor 18 to the NAND memory 10 and the memory controller 11 via the power supply circuit 17.

In an example, the power supply circuit 17 may monitor a voltage of the power supply 3. When the voltage becomes less than a predetermined threshold value, the power supply circuit 17 may determine the occurrence of power shutdown and transmit a power shutdown signal to the multicore processor 13. Then, the power supply circuit 17 may switch the power supply source from the power supply 3 to the capacitor 18. The multicore processor 13 may transmit a switching signal to the power supply circuit 17 according to the reception of the power shutdown signal, so that the power supply circuit 17 may switch the power supply source according to the switching signal.

The memory system 1b can employ an arbitrary battery as the capacitor 18. For example, an electrolytic capacitor or an electrical double layer capacitor can be employed.

The memory controller 11 may include the host interface controller (host I/F controller) 12, the multicore processor 13, the NAND controller 14, and the RAM 15.

The multicore processor 13 may control the memory controller 11 based on a firmware program. The firmware program, for example, may be stored in advance in a nonvolatile memory such as the NAND memory 10, may be read from the NAND memory 10 at the time of startup, and may be executed by the multicore processor 13.

When power is supplied from the power supply 3, the multicore processor 13 can perform data transmission between the host 2 and the NAND memory 10. The RAM 15 may include a buffer 151, and the multicore processor 13 may use the buffer 151 at the time of the data transmission.

In the buffer 151, arbitrary types of information can be stored. In some embodiments, in the buffer 151, transmission data may be buffered. In some embodiments, the buffer 151 may include translation information for managing correlation between a logical address and a physical position (e.g., physical address) in the NAND memory 10. The translation information, for example, may be stored in the NAND memory 10. The multicore processor 13 may cache the translation information from the NAND memory 10 to the buffer 151, and refer to or update the translation information on the buffer 151. The multicore processor 13 may write at least an updated part of the translation information on the buffer 151 back to the NAND memory 10 at a predetermined timing.

The RAM 15 may be a volatile memory. Thus, when the supply of power to the RAM 15 is stopped, the information in the buffer 151 may be lost. In order to prevent the information in the buffer 151 from being lost from the memory system 1b, when power shutdown of the power supply 3 occurs, the multicore processor 13 may save the information in the buffer 151 in the NAND memory 10 by using limited power accumulated in the capacitor 18. At the time of next startup, the information saved in the NAND memory 10, for example, can be restored in the buffer 151 at the time of next startup.

The multicore processor 13 may save only specific information of the information in the buffer 151, or may save all the information in the buffer 151. For example, the multicore processor 13 may save a part updated after being cached of the translation information in the buffer 151, or may save all the translation information in the buffer 151. Furthermore, the multicore processor 13 may save the information in the buffer 151 as is, or may perform processing such as format conversion for the information in the buffer 151 and then save the processed information.

In some embodiments, an operation mode, in which data transmission is performed using power supplied from the power supply 3, may be written as a normal mode. A mode, in which the information in the buffer 151 is saved in the NAND memory 10 by using power accumulated in the capacitor 18, may be written as a PLP (Power Loss Protection) mode.

The host I/F controller 12 may control a communication interface with the host 2. The host I/F controller 12 may perform data transmission between the host 2 and the RAM 15 under the control by the multicore processor 13. The NAND controller 14 may perform data transmission between the NAND memory 10 and the RAM 15 under the control by the multicore processor 13.

The multicore processor 13 may include a plurality of CPUs 13. As an example, the multicore processor 13 may include four CPUs 13 (a CPU 13a, a CPU 13b, a CPU 13c, and a CPU 13d).

The control of the memory controller 11 may be divided into a plurality of processes and is shared by the four CPUs 13. The plurality of processes constituting the control of the memory controller 11, for example, may include a process for receiving a request from the host 2, a process for correlating a logical address included in the access request with a physical position (e.g., physical address) in the NAND memory 10, a process for generating data in units of pages to be written in the NAND memory 10 from write target data sent from the host 2, a process for generating data to be sent to the host 2 from the data in units of pages read from the NAND memory 10, a process for accessing the NAND memory 10, and a process for controlling an overall processing sequence.

The four CPUs 13 may perform processes assigned thereto in the normal mode, thereby performing data transmission between the host 2 and the NAND memory 10.

In some embodiments, the four CPUs 13 may include one or more CPUs 13 that perform processes assigned thereto in the PLP mode, thereby saving the information in the buffer 151 in the NAND memory 10. The CPU 13, which saves the information in the buffer 151, may be denoted by a first processor.

In some embodiments, the four CPUs 13 may include one or more CPUs 13 that generalize the operation sequence of the multicore processor 13. The CPU 13, which generalizes the operation sequence of the multicore processor 13, may be denoted by a second processor.

In some embodiments, the four CPUs 13 can include one or more CPUs 13 which are required to perform the operations of the normal mode but are not required to perform the operations of the PLP mode. Such a CPU 13 may be denoted by a third processor.

In the RAM 15, mode identification information 152 may be stored. The second processor may write, in the mode identification information 152, information indicating whether the operation mode of the memory system 1b is the PLP mode. Each CPU 13 can recognize whether a current operation mode is the PLP mode by referring to the mode identification information 152. The mode identification information 152, for example, may be 1 bit-flag information, or may describe the type of the operation mode. A memory with the mode identification information 152 stored therein is not limited to the RAM 15.

Figure 14:
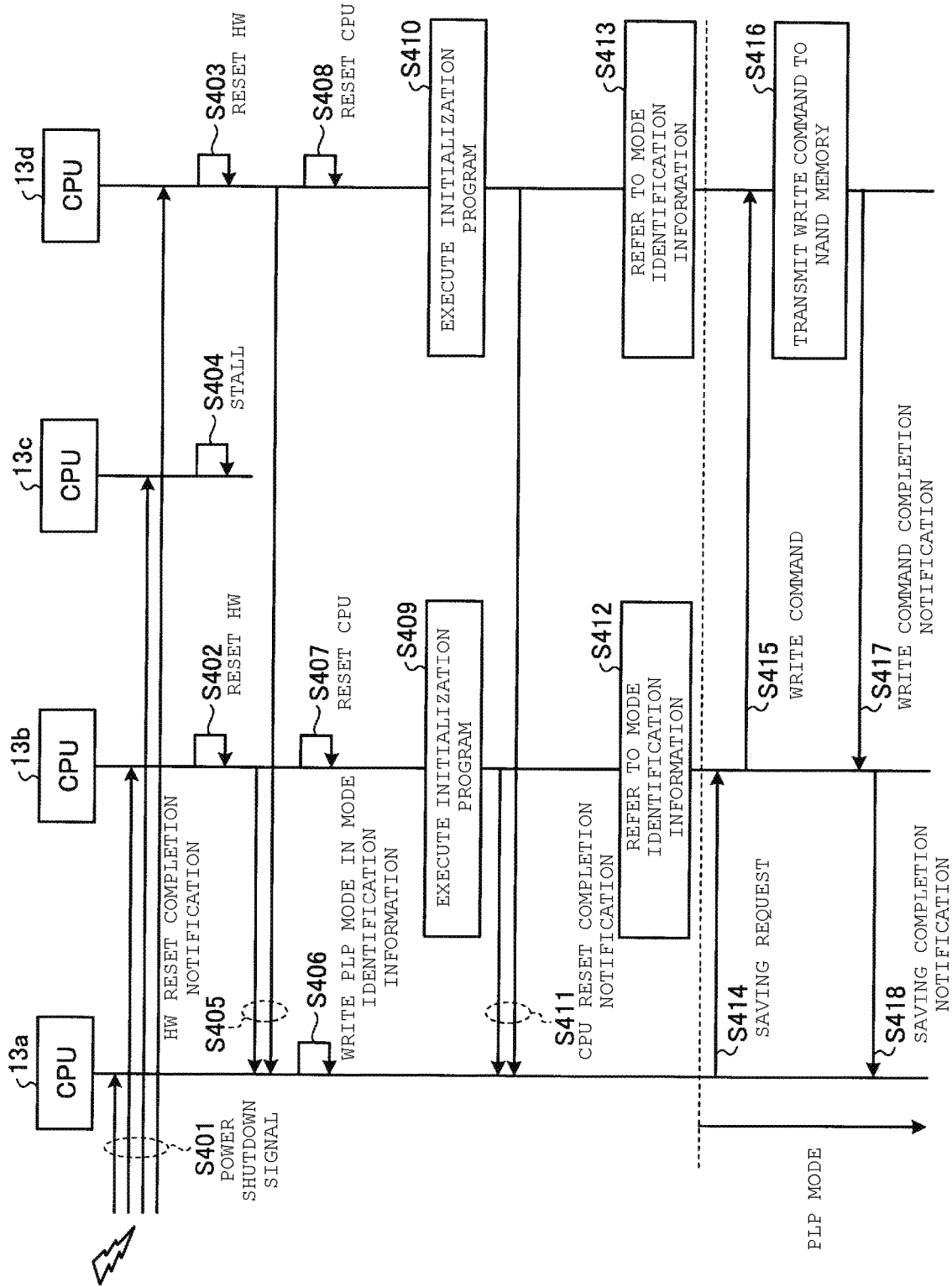
FIG. 14 is a sequence diagram for explaining an example of an operation of the memory system of some embodiments.

FIG. 14 is a sequence diagram for explaining an example of the operation of the memory system 1b of some embodiments. In the example as illustrated in FIG. 14, the CPU 13b and the CPU 13d may correspond to the first processor, the CPU 13a may correspond to the second processor, and the CPU 13c may correspond to the third processor.

When power shutdown of the power supply 3 occurs, the power shutdown may be detected by the power supply circuit 17. Then, the power supply circuit 17 may transmit a power shutdown signal to the multicore processor 13. Each CPU 13 may receive the power shutdown signal (S401).

The CPU 13b and the CPU 13d serving as the first processor may reset their own hardware according to the power shutdown signal, respectively (S402 and S403).

The CPU 13c serving as the third processor may stall itself according to the power shutdown signal (S404). Then, only the CPUs 13 (e.g., CPU 13a, CPU 13b, and CPU 13d) available for the operation in the PLP mode may operate.

The CPU 13c may be stalled by another processor (for example, the CPU 13a serving as the second processor).

After completing the reset of the hardware, each of the CPU 13b and the CPU 13d may transmit a hardware reset completion notification to the CPU 13a serving as the second processor (S405).

The CPU 13a may write the PLP mode in the mode identification information 152 according to the power shutdown signal (S406).

Furthermore, after transmitting the hardware reset completion notification, the CPU 13b and the CPU 13d may reset themselves, respectively (S407 and S408). After the reset, the CPU 13b and the CPU 13d may execute an initialization program included in the firmware, respectively (S409 and S410).

The initialization program executed in S409 and S410 may be the initialization program executed at the time of startup or a program similar thereto. That is, the initialization program executed in S409 and S410 may have commonality with the initialization program executed at the time of startup.

In the related art, when the operation mode is transitioned from the normal mode to the PLP mode, the CPU is not reset and may execute a program of the PLP mode. However, before executing the program of the PLP mode, it is necessary to perform initialization. Therefore, the firmware program needs to separately include a program, which performs operations similar to those of the initialization program at the time of startup, for the purpose of the PLP mode.

In some embodiments, in the transition to the PLP mode, each of the CPU 13b and the CPU 13d may be reset and then execute the initialization program. A procedure for executing the initialization program after the reset may be the same as that at the time of startup. Thus, the initialization program executed at the time of startup and the initialization program executed at the time of transition to the PLP mode can have commonality. The initialization program executed at the time of startup and the initialization program executed at the time of transition to the PLP mode may have commonality, so that the firmware program can be compact in size. The CPU 13b and the CPU 13d may be reset, so that control can be quickly shifted to the initialization program, resulting in a reduction of a time until the operation of the PLP mode starts to be performed.

In some embodiments, the CPU 13b and the CPU 13d may reset themselves. Each of the CPU 13b and the CPU 13d may be reset by the second processor (the CPU 13a).

After executing the initialization program, each of the CPU 13b and the CPU 13d may transmit a CPU reset completion notification to the CPU 13a (S411). Then, the CPU 13b and the CPU 13d may refer to the mode identification information 152, respectively (S412 and S413).

Each of the CPU 13b and the CPU 13d may refer to the mode identification information 152, thereby recognizing that a current operation mode is not the normal mode but the PLP mode. After recognizing that the current operation mode is the PLP mode, each of the CPU 13b and the CPU 13d may start to execute a program for the PLP mode.

If the PLP mode is not written in the mode identification information 152 or if the normal mode is written in the mode identification information 152, each CPU 13 can start to execute a program for performing the operation of the normal mode among programs included in the firmware program.

The subsequent operation is an example of the operation of the PLP mode. The operation of the PLP mode is not limited only to an operation to be described below.

In the PLP mode, the CPU 13a may transmit a saving request for saving the information in the buffer 151 in the NAND memory 10 to the CPU 13b (S414). When the saving request is received, the CPU 13b may specify information to be saved in the buffer 151. Then, the CPU 13b may generate a write command for writing the information to be saved in the NAND memory 10 and transmit the write command to the CPU 13d (S415).

In an example, one write command may be accompanied by data corresponding to the size of one page. The CPU 13b may generate data corresponding to the size of one page or more from the information to be saved. Then, the CPU 13b may generate a write command for each generated data, and transmit each generated write command to the CPU 13d.

The CPU 13d may transmit the received write command to the NAND memory 10 via the NAND controller 14 (S416). The CPU 13d may manage the progress of execution of the write command. When the execution of the write command is completed, the CPU 13d may transmit a write command completion notification to the CPU 13b (S417). When the write command completion notification is received, the CPU 13b may transmit a saving completion notification to the CPU 13a (S418). When the saving completion notification is received, the CPU 13a, for example, may power the memory system 1b off.

As described above, according to some embodiments, the multicore processor 13 may include the first processor (e.g., CPU 13b and CPU 13d). When power shutdown of the power supply 3 occurs, the first processor may be reset and then executes the initialization program. After the execution of the initialization program is completed, the first processor may save the information in the buffer 151 in the NAND memory 10. By such a configuration, the first processor may be reset, so that control can be quickly shifted to the initialization program, resulting in a reduction of a time until the operation of the PLP mode starts to be performed.

In some embodiments, the initialization program executed at the time of startup and the initialization program executed at the time of transition to the PLP mode may have commonality. By such a configuration, the firmware program can be compact in size.

In some embodiments, the multicore processor 13 may include the second processor (e.g., CPU 13a) which writes the fact that a current operation mode is the PLP mode in the mode identification information 152 in the RAM 15 when power shutdown of the power supply 3 occurs. After the execution of the initialization program, the first processor may confirm the current operation mode by referring to the mode identification information 152. When it is confirmed that the current operation mode is the PLP mode, the first processor may start the operation of the PLP mode. Since the first processor starts processes according to the operation mode after the execution of the initialization program, the initialization program executed at the time of startup and the initialization program executed at the time of transition to the PLP mode are possible.

In some embodiments, the multicore processor 13 may include the third processor (e.g., CPU 13c) which does not participate in the saving of the information in the buffer 151. The third processor may be stalled when power shutdown of the power supply 3 occurs. In this way, since the process not required in the PLP mode does not operate, power consumption in the PLP mode can be suppressed. Thus, it is possible to economize the capacity of the capacitor 18. Furthermore, since the CPU 13 not required in the PLP mode is stopped, it is possible to operate the CPU 13 required in the operation of the PLP mode for a longer time by limited power accumulated in the capacitor 18. As a consequence, it is possible to increase the amount of information which can be saved.

In some embodiments, when power shutdown of the power supply 3 occurs, the supply of a clock to the third processor may be stopped. In some embodiments, when the power shutdown of the power supply 3 occurs, the supply of power to the third processor may be stopped. When the power shutdown of the power supply 3 occurs, the third processor may stop operating by stall, e.g., by the stop of clock supply, the stop of power supply, and the like. Thus, it is possible to economize the capacity of the capacitor 18. When the third processor stops operating, it is possible that the third processor does not output signals to the bus.

While certain embodiments have been described, these embodiments have been presented byway of example only, and are not intended to limit the scope of the disclosure. Indeed, the embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory system comprising:
a first nonvolatile memory;
a second memory;
a first processor; and
a second processor,
wherein the first processor is configured to:
    calculate a first assignment amount indicating an operation time of the first nonvolatile memory,
    write the first assignment amount to the second memory, and
    cause the second processor to be transitioned to a second mode in response to receiving a notification from the second processor, and
wherein the second processor is configured to:
    perform access to the first nonvolatile memory in a first mode,
    calculate a consumed amount indicating an operation time of the first nonvolatile memory in the access,
    transmit the notification to the first processor when the consumed amount reaches the first assignment amount in the second memory, and
    stop access to the first nonvolatile memory in the second mode, wherein the first processor is configured to set each of a plurality of second assignment amounts with expiration dates at timings different from each other, and wherein the second processor is configured to determine that the plurality of second assignment amounts include (1) a first set of second assignment amounts with expiration dates that have been previously expired and (2) a second set of second assignment amounts with expiration dates that have not been previously expired, and transmit the notification to the first processor when the consumed amount reaches a total amount of the second set of second assignment amounts.

2. The memory system according to claim 1, wherein the first processor is configured to calculate respective ones of the plurality of second assignment amounts according to a usage condition of the memory system.

3. The memory system according to claim 1, wherein the access to the first nonvolatile memory includes a plurality of types of access including read, write, and erase, and the consumed amount is calculated according to the type of the access to the first nonvolatile memory.

4. The memory system according to claim 2, further comprising:

a temperature sensor, wherein the usage condition is a detection value of the temperature sensor.

5. The memory system according to claim 4, wherein the first processor is configured to feedback the detection value to an arithmetical calculation of the respective second assignment amounts.

6. The memory system according to claim 5, wherein the first processor is configured to calculate the respective second assignment amounts by the arithmetical calculation based on proportional-integral-derivative (PID) control.

7. The memory system according to claim 1, wherein the second memory has a region managed by a first-in-first-out (FIFO) rule, wherein the first processor is configured to sequentially write the plurality of second assignment amounts in the region of the second memory, and wherein the second processor is configured to:

determine a predetermined number of second assignment amounts, among the plurality of second assignment amounts, written in the region of the second memory, as second assignment amounts with expiration dates not expired.

8. The memory system according to claim 1, wherein, when a first predetermined time has elapsed after the second processor is transitioned to the second mode, the first processor is configured to cause the second processor to be transitioned to the first mode.

9. The memory system according to claim 1, wherein the second mode is a mode in which supply of a clock to the second processor is blocked.

10. The memory system according to claim 1, wherein in the first mode, the first processor is configured to set a new plurality of second assignment amounts when a second predetermined time has elapsed after the plurality of second assignment amounts are previously set.

* * * * *